(12) United States Patent
Hong et al.

(10) Patent No.: US 12,361,267 B2
(45) Date of Patent: Jul. 15, 2025

(54) OPERATION METHOD OF NEURAL NETWORK ELEMENT USING SPIN-ORBIT TORQUE

(71) Applicant: Industry-University Cooperation Foundation Hanyang University, Seoul (KR)

(72) Inventors: Jin Pyo Hong, Seoul (KR); Seung Mo Yang, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 1053 days.

(21) Appl. No.: 17/419,004

(22) PCT Filed: Dec. 31, 2019

(86) PCT No.: PCT/KR2019/018778
§ 371 (c)(1),
(2) Date: Jun. 28, 2021

(87) PCT Pub. No.: WO2020/141848
PCT Pub. Date: Jul. 9, 2020

(65) Prior Publication Data
US 2022/0114428 A1 Apr. 14, 2022

(30) Foreign Application Priority Data

Jan. 3, 2019 (KR) .................. 10-2019-0000751
Dec. 26, 2019 (KR) .................. 10-2019-0175589

(51) Int. Cl.
*G06N 3/063* (2023.01)
*H10N 50/20* (2023.01)
*H10N 52/80* (2023.01)

(52) U.S. Cl.
CPC ............ *G06N 3/063* (2013.01); *H10N 52/80* (2023.02)

(58) Field of Classification Search
CPC ......... H10N 52/00; H10N 50/20; H03K 19/18
See application file for complete search history.

(56) References Cited

U.S. PATENT DOCUMENTS 9,379,162 B2 6/2016 Bandyopadhyay et al.
2017/0236570 A1* 8/2017 Kent .................. G11C 11/1675
365/158

(Continued)

FOREIGN PATENT DOCUMENTS

KR 10-2018-0045302 A 5/2018
WO 2017/214628 A1 12/2017

OTHER PUBLICATIONS

International Search Report for PCT/KR2019/018778, dated Apr. 17, 2020.

*Primary Examiner* — Huy Q Phan
*Assistant Examiner* — Temilade S Rhodes-Vivour
(74) *Attorney, Agent, or Firm* — Sughrue Mion, PLLC

(57) ABSTRACT

Disclosed is an operation method of a neural network element using a Hall voltage. The neural network element has a hole pattern portion, and the hole pattern portion has a cross shape. When a pulse current is applied, horizontal magnetic anisotropy is formed in a ferromagnetic layer by means of spin-orbit torque, and when an external magnetic field in a direction perpendicular to the pulse current is applied, the inversion of magnetization occurs by means of additional torque. The movement of a magnetic domain wall is performed by the inversion of magnetization, spin electrons applied thereby are scattered, and a Hall voltage is generated according to the anomalous Hall effect. The (Continued)

generated Hall voltage increases according to the number of applications of the pulse current or pulse voltage.

7 Claims, 5 Drawing Sheets

(56) References Cited

U.S. PATENT DOCUMENTS

| | | |
|---|---|---|
| 2017/0249550 A1 | 8/2017 | Sengupa et al. |
| 2017/0270986 A1* | 9/2017 | Yoon ........................ G11C 11/18 |
| 2017/0330070 A1 | 11/2017 | Sengupta et al. |
| 2018/0285723 A1* | 10/2018 | Torng ....................... G11C 11/54 |
| 2019/0035449 A1* | 1/2019 | Saida ....................... G06N 3/084 |
| 2019/0058112 A1* | 2/2019 | Chen ....................... H10B 61/00 |
| 2019/0325961 A1* | 10/2019 | Jaiswal ................. G11C 11/419 |

* cited by examiner

[FIG. 1]
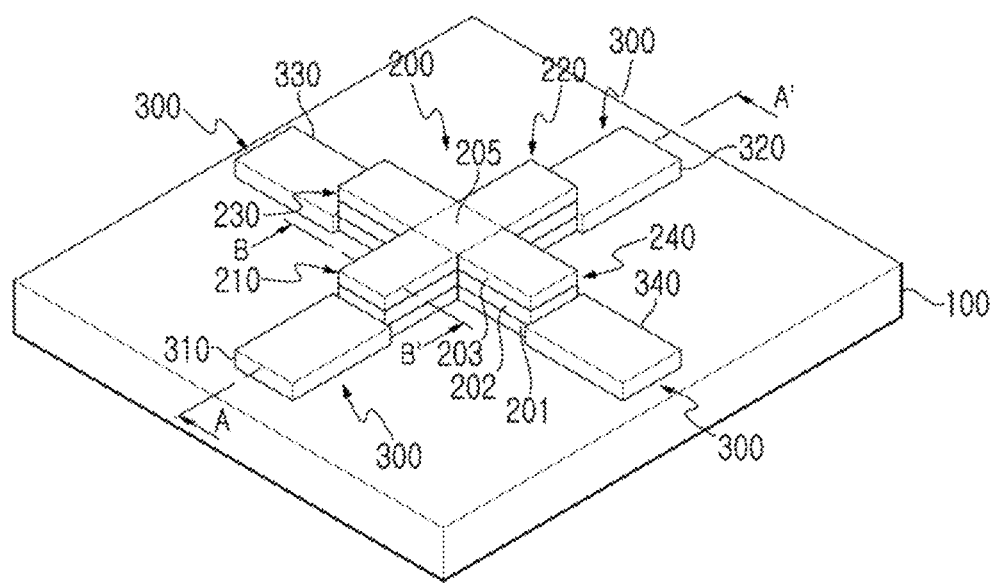
[FIG. 2]
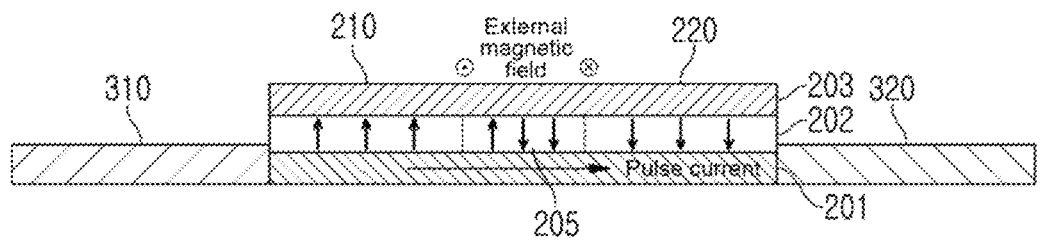

[FIG. 3A]
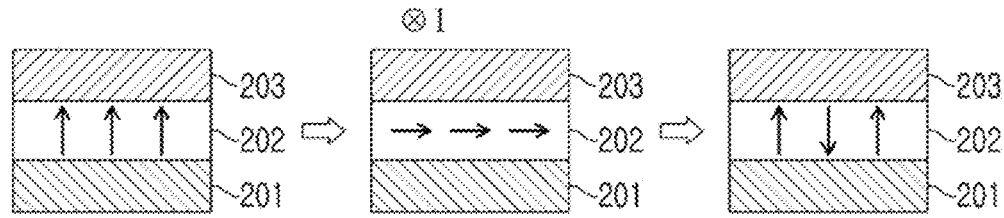
[FIG. 3B]
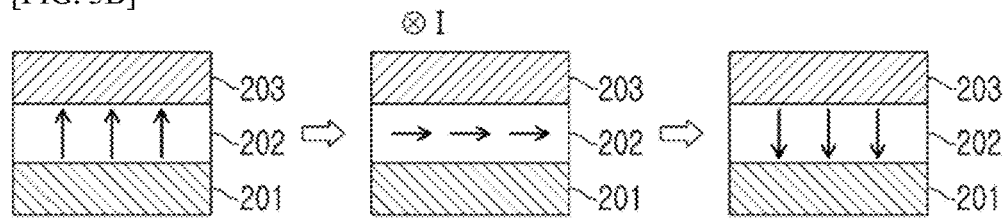
[FIG. 4]
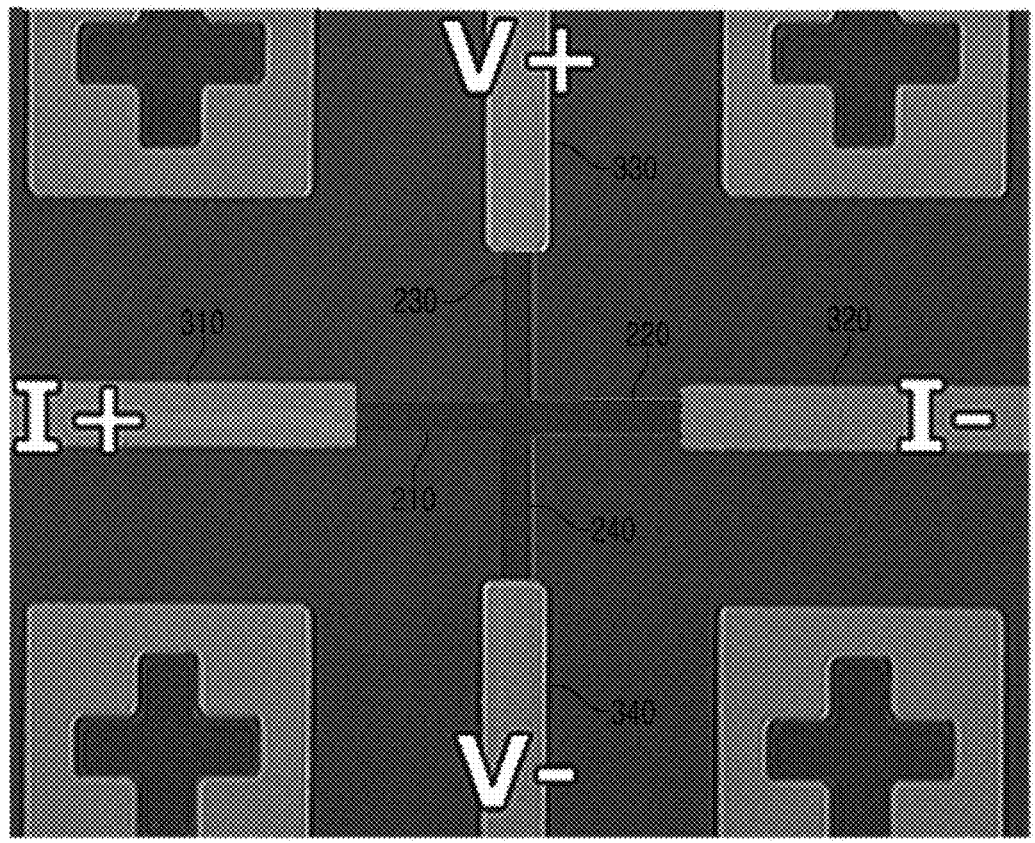

[FIG. 5]
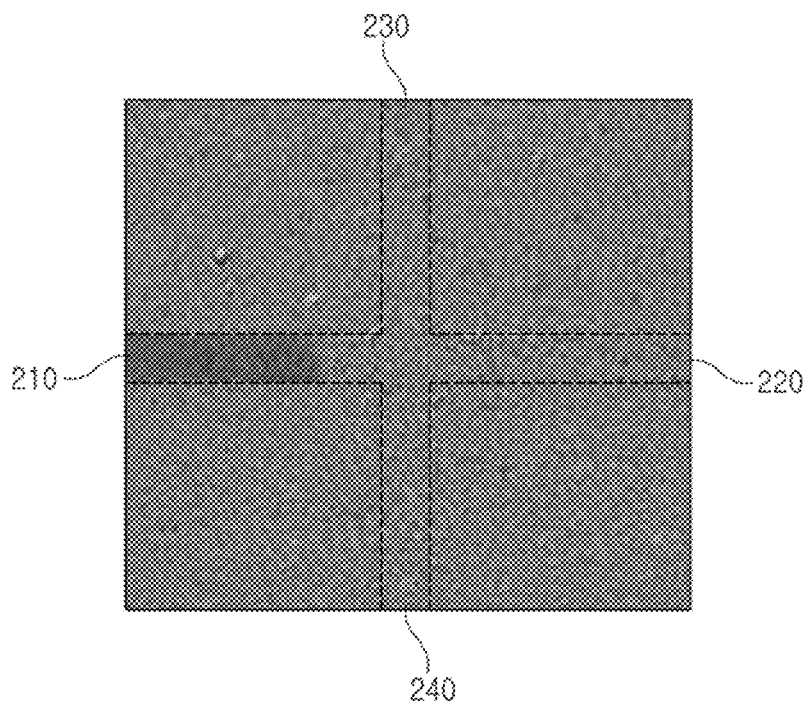
[FIG. 6]
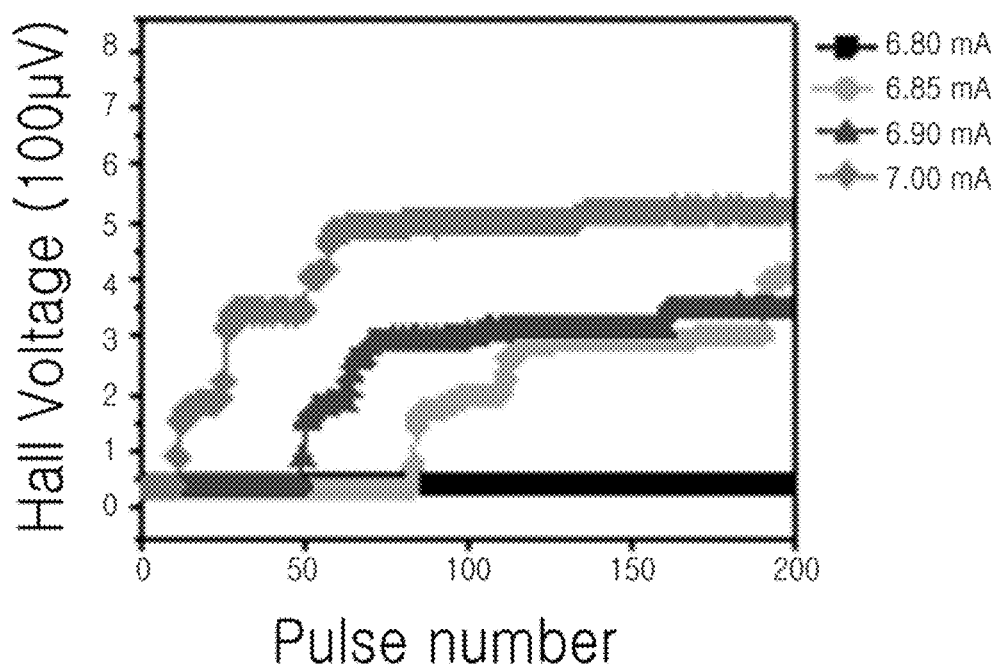

[FIG. 7]
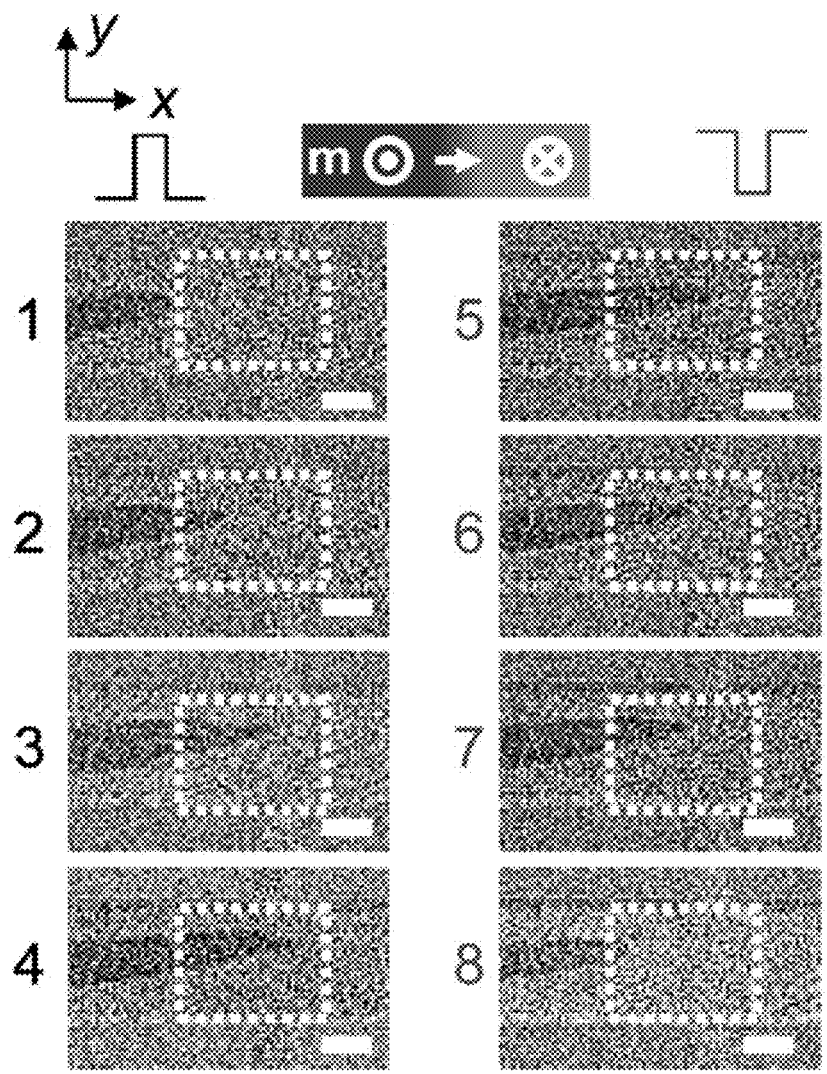

[FIG. 8]
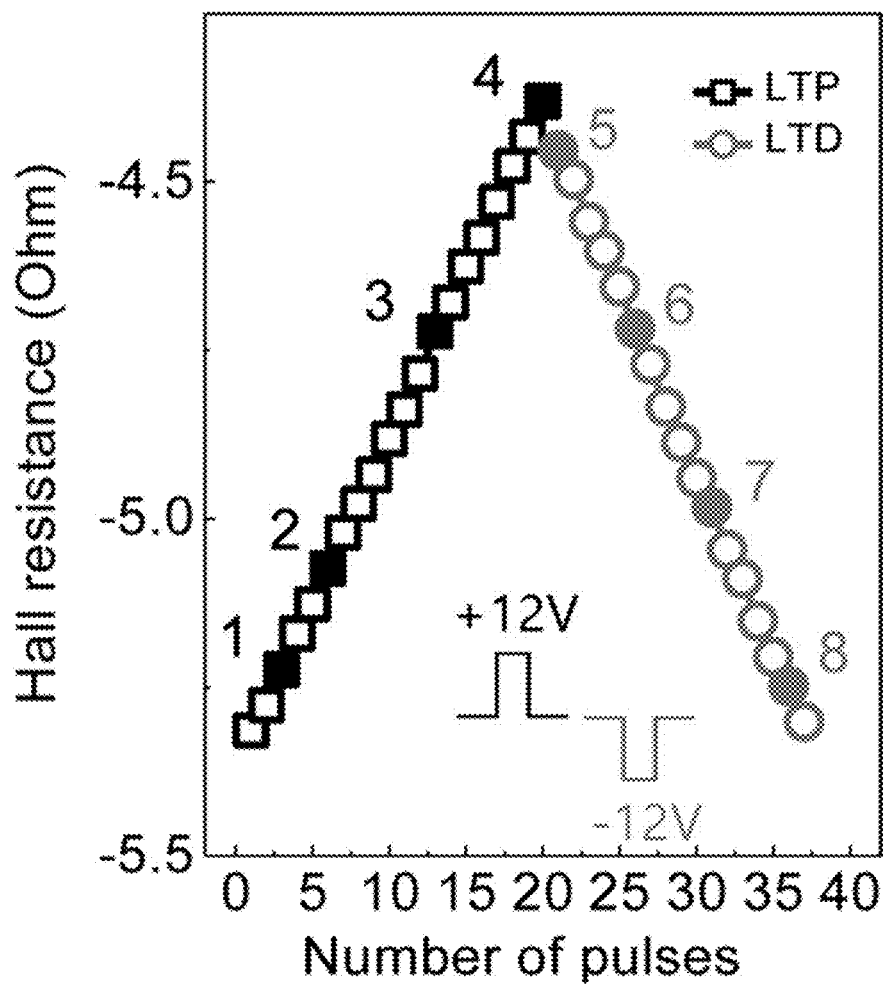

US 12,361,267 B2

OPERATION METHOD OF NEURAL NETWORK ELEMENT USING SPIN-ORBIT TORQUE

CROSS REFERENCE TO RELATED APPLICATIONS

This application is a National Stage of International Application No. PCT/KR2019/018778 filed Dec. 31, 2019, claiming priority based on Korean Patent Application No. 10-2019-0000751 filed Jan. 3, 2019 and Korean Patent Application No. 10-2019-0175589 filed Dec. 26, 2019.

TECHNICAL FIELD

The present invention relates to a method of operating a neural network device, and more specifically, to a method of operating a neural network device using a Hall voltage that increases or decreases in stages according to movement of a magnetic domain wall using spin orbit torque.

BACKGROUND ART

Recently, with the emergence of deep learning, research on artificial neural networks has been actively conducted. In order to effectively construct an artificial neural network, there is a need for a device that performs learning and computation functions similar to the human brain. In order to simulate the learning ability of a human, hardware that serves as neurons and synapses is required, and such hardware is referred to as a neural network device.

The neural network device needs to perform an operation similar to a biological synapse operation according to an applied stimulus. Synapses are disposed between and connect neurons, and spike signals between neurons are transmitted through synapses. The strength of the synapse may change according to the number of repetitions of the same type of signals transmitted to the neuron or the weight of transmitted information.

In the case of a typical neural network device, the above-described operation is realized by a memristor device of which a resistance changes according to an applied stimulus or current. That is, as the number of repetitions of stimulation to the device increases, the resistance of the memristor device continuously decreases or continuously increases. With such a configuration, a synaptic operation may be implemented.

However, the memristor device whose resistance changes according to the applied stimulus needs to be supplied with a voltage or current to detect the resistance and detect a change in current or output voltage according to the applied voltage. Accordingly, the range of fluctuation of the output voltage or current is determined according to a change in resistance, and there is also a need to perform a reset operation using a high reverse voltage. The reset operation is for returning to a state before the change in resistance and induces disappearance or formation of conductive filaments in a resistive switching layer forming the memristor.

The resistive switching layer includes an isomeric oxide or chalcogenide material having a non-stoichiometric configuration. Such a material uses a model of generation and disappearance of conductive filaments, and is characterized in that the resistance state changes according to the number or density of the conductive filaments. In addition, the conductive filaments need to be supplied with a reverse bias for a long time for a reset or forming operation, and after the reset or forming operation, may not operate stably. That is, repeated use may cause the resistance state to fluctuate, which may inhibit stable operation.

Therefore, there is still a need for development of a neural network device capable of performing a stable synaptic operation without using a change in a resistance state and a method of operating the same.

DISCLOSURE

Technical Problem

The present invention is directed to providing a method of operating a neural network device in which a Hall voltage is changed according to the number of times a pulse current is applied using an anomalous Hall Effect, so that an operation of a neural network device is implemented.

Technical Solution

One aspect of the present invention provides a method of operating a neural network device including a Hall pattern part having a cross shape and an interconnection part electrically connected to the Hall pattern part on a substrate, the method including: applying a pulse current to the Hall pattern part and applying an external magnetic field in a direction of the pulse current; and inducing magnetic switching and movement of a magnetic domain wall using spin orbit torque in a ferromagnetic layer of the Hall pattern part by the pulse current and the external magnetic field to gradually increase a Hall voltage.

Advantageous Effects

According to the present invention described above, when a pulse current is applied, a magnetic moment parallel to a direction in which the current is applied is induced in a ferromagnetic layer by spin orbit torque. In addition, when an external magnetic field is applied in a direction perpendicular to the application direction of the current, magnetic switching is induced in the ferromagnetic layer due to torque caused by the external magnetic field. Since the applied current has the form of a pulse, a magnetic domain wall of the ferromagnetic layer moves according to the application of the pulses. A Hall pattern part according to the present invention has a cross shape and includes a current input terminal and a current output terminal facing each other with a crossing region therebetween. When a pulse current is applied through the current input terminal, the magnetic domain wall having perpendicular magnetic anisotropy expands toward the crossing region. The movement of the magnetic domain wall is achieved by magnetic switching, a spin current is biased in the ferromagnetic layer having perpendicular magnetic anisotropy, and a Hall voltage is formed at a Hall voltage output terminal arranged perpendicular to a bar shape defined by the current input terminal and the current output terminal.

In particular, the movement of the magnetic domain wall due to the magnetic switching occurring in the crossing region causes an increase in the Hall voltage. In order for the magnetic domain wall to move, the pulse current needs to be repeatedly applied. With such a configuration, the magnetic domain wall moves in the crossing region, and a region having perpendicular magnetic anisotropy expands. Accordingly, the level of the Hall voltage due to the applied pulse current also increases.

However, in a case where the magnetic domain wall, which defines a region having perpendicular magnetic anisotropy, is adjacent to the current output terminal and occupies the entire area of the crossing region, even when the magnetic domain wall moves, the Hall voltage does not additionally increase but is saturated. This is because, when the pulse current is applied, the spin current is sufficiently biased by the perpendicular magnetic anisotropy that has been already formed, and the movement of the magnetic domain wall adjacent to the current output terminal does not have a large influence on the change of the Hall voltage.

Therefore, when an external magnetic field parallel to the applied pulse current is applied, the magnetic domain wall moves, and the Hall voltage gradually changes due to the movement of the magnetic domain wall. This enables an operation of a neural network device having a learning effect on a stimulus, which is an input current, to be implemented, thereby implementing the neural network device.

DESCRIPTION OF DRAWINGS

FIG. 1 is a perspective view illustrating a neural network device according to an exemplary embodiment of the present invention.

FIG. 2 is a schematic diagram of the neural network device shown in FIG. 1, which is taken along line A-A' to describe an operation of the neural network device of FIG. 1 according to an exemplary embodiment of the present invention.

FIGS. 3A and 3B show conceptual diagrams taken along line B-B' of the neural network device shown in FIG. 1 to describe movement of a magnetic domain wall according to an exemplary embodiment of the present invention.

FIG. 4 is an image illustrating a neural network device according to a manufacturing example of the present invention.

FIG. 5 is an image illustrating movement of a magnetic domain wall of the neural network device shown in FIG. 4 according to a manufacturing example of the present invention.

FIG. 6 is a graph showing a Hall voltage of the neural network device disclosed in FIG. 4 according to a manufacturing example of the present invention.

FIG. 7 is an image of continuous shots of movement of the magnetic domain wall when a pulse voltage is applied to the neural network device shown in FIG. 4 according to a manufacturing example of the present invention.

FIG. 8 is a graph showing measurements of a Hall resistance according to the movement of the magnetic domain wall shown in FIG. 7 according to a manufacturing example of the present invention.

BEST MODE OF THE INVENTION

While the present invention is subject to various modifications and alternative embodiments, specific embodiments thereof are shown by way of example in the accompanying drawings and will be described. However, it should be understood that there is no intention to limit the present invention to the particular embodiments disclosed, but on the contrary, the present invention is to cover all modifications, equivalents, and alternatives falling within the spirit and scope of the present invention. Like numbers refer to like elements throughout the description of the figures.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present invention will be described with reference to the accompanying drawings in detail.

Embodiment

FIG. 1 is a perspective view illustrating a neural network device according to an exemplary embodiment of the present invention.

Referring to FIG. 1, a neural network device according to the embodiment has a Hall pattern part 200 and an interconnection part 300. The Hall pattern part 200 has a cross shape formed on a substrate 100, and the interconnection part 300 is electrically connected to the Hall pattern part 200.

The Hall pattern part 200 includes a non-magnetic metal layer 201, a ferromagnetic layer 202, and a tunnel barrier layer 203 on the substrate 100. In addition, according to embodiments, a capping layer (not shown) is formed on the tunnel barrier layer 203. The non-magnetic metal layer 201 has Ta, Hf, W, Nb, or an alloy thereof. The ferromagnetic layer 202 has Co, Fe, Ni, Mn, or an alloy of one or more thereof, and preferably includes CoFeB, NiFe, CoPt, CoPd, FePt, or FePd. As the tunnel barrier layer 203, an oxide such as MgOx or AlOx is used.

The ferromagnetic layer 202 formed on the non-magnetic metal layer 201 has perpendicular magnetic anisotropy. For the perpendicular magnetic anisotropy, the ferromagnetic layer 202 preferably has a thickness of 0.5 nm to 2.0 nm. When the thickness of the ferromagnetic layer 202 is less than 0.5 nm, the ferromagnetic layer 202 is not formed in a uniform film quality and is formed in an island shape on the non-magnetic metal layer 201. In addition, when the thickness of the ferromagnetic layer 202 exceeds 2.0 nm, the perpendicular magnetic anisotropy of the ferromagnetic layer 202 may not be secured.

In addition, when a current flows through the non-magnetic metal layer 201, spin orbit coupling occurs in the non-magnetic metal layer 201. Spin electrons with the same spin are aggregated in a specific direction by spin orbit coupling. In addition, in the ferromagnetic layer 202 formed on the non-magnetic metal layer 201, magnetization of the ferromagnetic material is caused to receive a rotational force. This is referred to as spin orbit torque. That is, in the ferromagnetic layer 202, spin orbit torque causes magnetization to be oriented in a specific direction by an influence of a direction in which a current is applied.

In addition, when a magnetic field is applied in a direction parallel to the surface of the ferromagnetic layer 202 and perpendicular to the applied current or voltage, a gradual magnetic switching may be induced in the ferromagnetic layer, and the magnetic domain wall moves according to the number of times the pulse current or pulse voltage is applied. According to the movement of the magnetic domain wall, the region of the ferromagnetic layer having perpendicular magnetic anisotropy expands, which increases the anomalous Hall Effect in the Hall pattern part 200 and generates a Hall voltage. Accordingly, a gradual increase in Hall voltage may be observed.

For the above-described operation, the Hall pattern part 200 has a cross-shaped structure, and includes a current input terminal 210, a current output terminal 220, and Hall voltage output terminals 230 and 240. The current input terminal 210 is a terminal arranged opposite to the current output terminal 220 and to which a pulse current or pulse voltage is applied. The applied pulse current or pulse voltage flows toward the current output terminal 220, and the movement of the magnetic domain wall may start from the current input terminal 210 and end at the current output terminal 220.

In particular, when the movement of the magnetic domain wall due to magnetic switching in a cross region 205 of the Hall pattern part 200 occurs, the Hall voltage tends to increase or decrease according to the movement phenomenon of the magnetic domain wall.

In addition, the interconnection part 300 includes an input current interconnection 310, an output current interconnection 320, and Hall voltage interconnections 330 and 340. The input current interconnection 310 is connected to the current input terminal 210 of the Hall pattern part 200, and the output current interconnection 320 is connected to the current output terminal 220. In addition, the Hall voltage interconnections 330 and 340 are connected to the Hall voltage output terminals 230 and 240. The interconnection part 300 may be formed as a physical extension of the non-magnetic metal layer 201 of the Hall pattern part 200 and may be formed as a separate metal layer electrically connected to the ferromagnetic layer 202.

A pulse current is applied from the input current interconnection 310 to the current input terminal 210, and the pulse current passes through the current output terminal 220 and is discharged to the outside through the output current interconnection 320. Through the flow of a pulse current, an anomalous Hall Effect occurs in the Hall pattern part 200 and a Hall voltage is generated between the two terminals constituting the Hall voltage interconnections 330 and 340 due to the anomalous Hall Effect.

FIG. 2 is a schematic diagram of the neural network device shown in FIG. 1, which is taken along line A-A' to describe an operation of the neural network device of FIG. 1 according to an exemplary embodiment of the present invention.

Referring to FIG. 2, a pulse current is applied through the input current interconnection 310. The applied pulse current is discharged through the output current interconnection 320. The pulse current allows spin orbit coupling to occur in the non-magnetic metal layer 201. The spin orbit coupling allows magnetization torque to be generated in the ferromagnetic layer 202, which induces a spin orbit torque. The spin orbit torque allows the magnetic domain wall of the ferromagnetic layer 202 to move toward the current output terminal 320.

However, with only the applied pulse current, the movement of the magnetic domain wall may be not performed easily. In order to enhance the movement of the magnetic domain wall, an external magnetic field that is parallel to a surface of the ferromagnetic layer 202 and perpendicular to a virtual line from the current input terminal 210 to the current output terminal 220 is applied. The application of the external magnetic field allows movement of the magnetic domain wall in the ferromagnetic layer 202 to be reinforced.

However, the movement of the magnetic domain wall occurs only between the current input terminal 210 and the current output terminal 220 in the cross-shaped Hall pattern part. That is, the magnetic domain wall does not move toward the Hall voltage output terminal. This is because the applied pulse current or pulse voltage flows between the current input terminal 210 and the current output terminal 220. That is, the region in which the spin orbit torque is generated by the pulse current flowing through the non-magnetic metal layer 201 and the ferromagnetic layer 202 is a bar-shaped region occupied by the current input terminal 210 and the current output terminal 220, and in particular, the movement of the magnetic domain wall due to the magnetic switching occurring in the cross region 205 has a great influence on the change of the Hall voltage.

In addition, the movement of the magnetic domain wall, which is enhanced by the application of an external magnetic field, intensifies the anomalous Hall Effect and increases the Hall voltage.

Magnetization in a specific direction within the ferromagnetic layer 202 serves as like an external magnetic field. Electrons flowing through the input current interconnection 310 or the output current interconnection 320 have up-spins and down-spins at the same proportion, but when the electrons flow through the ferromagnetic layer 202, up-spins and down-spins are affected by the magnetic moment of the ferromagnetic layer 202, and accordingly, the electrons having up-spins and the electrons having down-spins are biased to the Hall voltage output terminal, which corresponds to a side of the Hall pattern part of the cross-shaped structure.

In addition, when spin electrons moving between the current input terminal 210 and the current output terminal 220 of the Hall pattern part collide with an impurity, which is a ferromagnetic material, (material having a spin orbit coupling), skew scattering occurs, and the direction of skew scattering appears differently depending on the spin direction of the electron. When the ferromagnetic layer 202 does not have perpendicular magnetic anisotropy and has a random magnetic moment, the skew scattering of spin electrons is also randomly generated, and thus a Hall voltage is not generated.

However, when the ferromagnetic layer 202 is provided with perpendicular magnetic anisotropy through the movement of the magnetic domain wall, since the impurity itself is a ferromagnetic material, the degree of scattering varies according to the spin of the electron due to spin-dependent scattering, the amount of electrons moving to the output terminal is changed, and a Hall voltage is generated. With such a configuration, an anomalous Hall Effect may be obtained.

FIGS. 3A and 3B show conceptual diagrams taken along line B-B' of the neural network device shown in FIG. 1 to describe movement of a magnetic domain wall according to an exemplary embodiment of the present invention.

Referring to FIGS. 3A and 3B, the conceptual diagrams illustrate states when viewed from a current input terminal to a current output terminal.

Thus, the current flows in a direction in which the current enters the paper surface. FIG. 3A shows a motion of magnetic moment when an external magnetic field is not applied, and FIG. 3B shows a motion of magnetic moment when an external magnetic field is applied.

First, in FIG. 3A, the ferromagnetic layer 202 has perpendicular magnetic anisotropy toward the tunnel barrier layer 203. When a current flows through the non-magnetic metal layer 201, the magnetic moment of the ferromagnetic layer 202 is switched in the horizontal direction due to the influence of spin orbit torque. However, due to the inherent limitation of the spin orbit torque, a factor that reverses upward magnetization to downward magnetic moment is not shown. Accordingly, when the pulse is removed from the pulse current, the magnetization in a horizontal state in the current direction is caused to have a mixture of upward and downward magnetic moments. That is, when no external magnetic field is applied, movement of a magnetic domain wall does not occur, and when no current is removed, random perpendicular magnetic anisotropy is shown.

As disclosed in FIG. 3B, when an external magnetic field is applied in a direction perpendicular to the current, magnetic switching is induced. First, in a state in which the ferromagnetic layer 202 has magnetic moment in an upward direction, and a current flows in the direction it enters the paper surface, the magnetization of the ferromagnetic layer 202 is switched in the horizontal direction by the spin orbit torque, representing horizontal magnetic anisotropy. When an external magnetic field is applied while the supply of the pulse current is cut off, a torque of B (magnetic field)×M (magnetic moment) is generated, and a switching operation is performed to convert the magnetic moment in the horizontal direction to the downward direction. With such a configuration, magnetic switching is induced.

That is, the magnetic switching is induced by the external magnetic field, and this is shown in the form of movement of a magnetic domain wall.

Manufacturing Example: Fabrication of a Neural Network Device in the Form of a Hall Device A neural network device is fabricated. The fabricated neural network device has a Hall pattern part and an interconnection part due to a patterning process.

FIG. 4 is an image illustrating a neural network device according to a manufacturing example of the present invention.

Referring to FIG. 4, a Hall pattern part has a cross-shape. In the Hall pattern part, the distance between ends of a current input terminal and a current output terminal is 110 μm, and the width of the Hall pattern part is 10 μm. In addition, the width of an interconnection part is set to 20 μm.

$SiO_2$ is used for a substrate at a lower side, and W is used for a non-magnetic metal layer. The thickness of the non-magnetic metal layer is 2 nm. A ferromagnetic layer formed on the non-magnetic metal layer is formed of CoFeB and has a thickness of 1.5 nm. In addition, a tunnel barrier layer formed on the ferromagnetic layer is formed of MgO and has a thickness of 1.2 nm.

The interconnection part is formed of W. A pulse current may be applied between an input current interconnection and an output current interconnection of the interconnection portion at a level of about 7 mA, and the time for supplying one pulse is 0.5 sec to 1.5 sec.

In addition, an external magnetic field is applied in a direction perpendicular to the current direction. Depending on embodiments, the external magnetic field may be applied in various magnitudes.

FIG. 5 is an image illustrating movement of a magnetic domain wall of the neural network device shown in FIG. 4 according to a manufacturing example of the present invention.

Referring to FIG. 5, when a conventional optical microscope is used, movement of the magnetic domain wall may not be observed, and only the image of FIG. 4 is shown. However, in the case of using a magneto-optical Kerr effect (MOKE) microscope, a different shade is shown depending on the magnetization direction of the magnetic domain wall. However, only the shade according to the magnetization direction of the magnetic domain wall is shown, and a conventional optical image is not shown.

In FIG. 5, an area indicated by a dotted line represents a Hall pattern part, and a dark part inside the dotted line represents a magnetization region in which a magnetic moment faces the paper surface. In a state in which a pulse current is applied to the current input terminal and an external magnetic field is applied in a direction perpendicular to the current direction, when the number of pulse currents increases, the magnetization region in which the magnetic moment faces outward from the paper surface increases. That is, movement of the magnetic domain wall occurs, and the magnetic domain wall moves toward the current output terminal. The movement of the magnetic domain wall is a phenomenon in which magnetic moments toward the outside of the paper surface increase, which is shown as a dark part moving toward the current output terminal in FIG. 5.

FIG. 6 is a graph showing a Hall voltage of the neural network device disclosed in FIG. 4 according to a manufacturing example of the present invention.

Referring to FIG. 6, the time of applying one pulse current is 100 msec, and the time interval between pulses is 500 msec. In addition, the magnitude of the applied pulse current is in the range of 6.8 mA to 7 mA, and the applied external magnetic field is 70 Oe.

When the magnitude of the pulse current is 6.8 mA, no Hall voltage is generated even when the number of pulse currents increases. In addition, as the magnitude of the pulse current increases to 7 mA, the Hall voltage rapidly increases in proportion to the number of pulses. In general, as the magnitude of the pulse current increases, a higher Hall voltage is formed, and as the number of pulse currents increases, the Hall voltage tends to gradually increase.

This means that the above described operation may be used as an operation of a neural network device whose output voltage varies in proportion to the number of applied stimulations.

The above operation may be described with reference to movement of a magnetic domain wall in the Hall pattern part. That is, when a pulse current flows through the current input terminal and the current output terminal of the Hall pattern part, and an external magnetic field is applied perpendicularly to the pulse current, the magnetic domain wall moves from the current input terminal to the current output terminal of the Hall pattern part. The movement of the magnetic domain wall magnetized in a specific direction increases the anomalous Hall Effect, thereby forming a high Hall voltage. That is, when the magnitude of the pulse current is greater than or equal to a certain level and the number of pulse currents increases, the magnetic domain wall gradually moves toward the current output terminal. Accordingly, the magnetic domain wall magnetized in a specific direction increases, which gradually increases the Hall voltage caused by the anomalous Hall effect.

In addition, when a reverse current is applied from the current output terminal to the current input terminal, the magnetic domain wall of the Hall pattern part is reset, and the Hall voltage returns to its original state.

FIG. 7 is an image of continuous shots of movement of the magnetic domain wall when a pulse voltage is applied to the neural network device shown in FIG. 4 according to a manufacturing example of the present invention.

Referring to FIG. 7, a driving voltage in the form of a pulse train is applied. That is, the driving voltage is applied in a direction from the input current interconnection to the output current interconnection. The applied driving voltage is applied for 50 ms with a peak value of 12 V. After one pulse is applied, an image is captured through an MOKE microscope.

An external magnetic field is applied at 450 gauss and is directed from V− to V+ in FIG. 4. A dark color in the image indicates that the magnetic moment is directed from the inside of the paper surface to the outside of the paper surface due to the movement of the magnetic domain wall of the Hall pattern part. It can be seen that when the number of times the pulse voltage is applied increases, the magnetic domain wall of the Hall pattern part moves linearly to the right.

After the pulse voltage is applied four times, a pulse in a reverse direction is applied. The pulse in the reverse direction has an exactly inverse phase to the pulse in the forward direction. That is, the pulse in the reverse direction has a peak value of −12 V and is applied for 50 ms. As the number of pulses increases, the magnetic domain wall proceeds toward the input current interconnection, in contrast to the case where the pulse in the forward direction is applied.

FIG. 8 is a graph showing measurements of a Hall resistance according to the movement of the magnetic domain wall shown in FIG. 7 according to a manufacturing example of the present invention.

Referring to FIG. 8, a part marked as LTP shows a Hall resistance when a forward pulse is applied, and a part marked as LTD shows a Hall resistance when a reverse pulse is applied. In addition, in FIG. 8, the resistance is measured based on the V+ terminal, and the resistance having a negative value is converted into an absolute value to describe the magnitude of the resistance.

In addition, the Hall resistance is a converted value obtained by dividing the peak value of the measured Hall voltage by the peak value of the pulse current converted by the applied pulse voltage Hall resistance decreases linearly as the number of forward pulses increases. In addition, it can be seen that the Hall resistance increases linearly as the number of reverse pulses increases. That is, when a pulse voltage is applied, it can be seen that the Hall device according to the present invention exhibits extreme linearity and the operations through the forward pulse and the reverse pulse are mutually reversible.

According to the present invention described above, when a pulse current or pulse voltage is applied, a magnetic moment parallel to a direction in which the current is applied is induced in a ferromagnetic layer due to spin orbit torque. In addition, when an external magnetic field is applied in a direction perpendicular to the application direction of the current, magnetic switching is induced in the ferromagnetic layer due to torque caused by the external magnetic field. Since the applied current has the form of a pulse, a magnetic domain wall of the ferromagnetic layer moves according to the application of the pulse. A Hall pattern part according to the present invention has a cross shape and includes a current input terminal and a current output terminal facing each other with a crossing region therebetween. When a pulse current is applied through the current input terminal, the magnetic domain wall having perpendicular magnetic anisotropy expands toward the crossing region. The movement of the magnetic domain wall is achieved by magnetic switching, a spin current is biased in the ferromagnetic layer having perpendicular magnetic anisotropy, and a Hall voltage is formed at a Hall voltage output terminal arranged perpendicular to a bar shape defined by the current input terminal and the current output terminal.

In particular, the movement of the magnetic domain wall due to the magnetic switching occurring in the crossing region causes an increase in the Hall voltage. In order for the magnetic domain wall to move, the pulse current needs to be repeatedly applied. With such a configuration, the magnetic domain wall moves in the crossing region, and a region having perpendicular magnetic anisotropy expands. Accordingly, the level of the Hall voltage due to the applied pulse current also increases.

However, when the magnetic domain wall, which defines a region having perpendicular magnetic anisotropy, is adjacent to the current output terminal and occupies the entire area of the crossing region, even when the magnetic domain wall moves, the Hall voltage does not additionally increase but is saturated. This is because, when the pulse current is applied, the spin current is sufficiently biased by the perpendicular magnetic anisotropy that has been already formed, and the movement of the magnetic domain wall adjacent to the current output terminal does not have a large influence on the change of the Hall voltage.

Therefore, when an external magnetic field parallel to the applied pulse current is applied, the magnetic domain wall moves, and the Hall voltage gradually changes due to the movement of the magnetic domain wall. This enables an operation of a neural network device that has a learning effect on a stimulus, which is an input current, to be implemented, thereby implementing the neural network device.

The invention claimed is:
1. A method of operating a neural network device including a Hall pattern part having a cross shape and an interconnection part electrically connected to the Hall pattern part on a substrate, the method comprising:
  applying a pulse current or pulse voltage to the Hall pattern part and applying an external magnetic field in a direction perpendicular to a direction of the pulse current; and
  inducing magnetic switching and movement of a magnetic domain wall using spin orbit torque in a ferromagnetic layer of the Hall pattern part by the pulse current and the external magnetic field to gradually increase a Hall voltage,
  wherein the Hall pattern part includes a nonmagnetic metal layer formed on the substrate, the ferromagnetic layer formed on the nonmagnetic metal layer and configured to induce generation of the Hall voltage by the movement of the magnetic domain wall, and a tunnel barrier layer configured to induce perpendicular magnetic anisotropy of the ferromagnetic layer.

2. The method of claim 1, wherein, upon application of the pulse current or pulse voltage and the external magnetic field, perpendicular magnetic anisotropy of the Hall pattern part is expanded through the movement of the magnetic domain wall toward a current output terminal by the magnetic switching.

3. The method of claim 2, wherein the expansion through the movement of the magnetic domain wall includes:
  causing the ferromagnetic layer to have horizontal magnetic anisotropy by the spin orbit torque based on the pulse current or pulse voltage applied to the nonmagnetic metal layer; and,
  causing the magnetic switching to occur in the ferromagnetic layer by torque induced by the external magnetic field applied while the pulse current or pulse voltage is cut off.

4. The method of claim 1, wherein the Hall pattern part includes:
  a current input terminal to which the pulse current is applied;
  a current output terminal arranged opposite to the current input terminal and from which the pulse current or pulse voltage is discharged; and a Hall voltage output terminal configured to cross the current input terminal and the current output terminal through a crossing region and generate the Hall voltage.

5. The method of claim 4, wherein the Hall voltage gradually increases or decreases according to a number of times the pulse current or pulse voltage is applied.

6. The method of claim 5, wherein the Hall voltage is saturated when the crossing region is filled with the perpendicular magnetic anisotropy.

7. The method of claim 1, further comprising, after the gradually increasing of the Hall voltage, applying a current in a reverse direction of the pulse current to reset the Hall voltage.

* * * * *